United States Patent
Lwee

[11] Patent Number: 5,906,510
[45] Date of Patent: May 25, 1999

[54] MULTI-STORAGE DECK CONNECTOR APPARATUS

[75] Inventor: Nai Hock Lwee, Singapore, Singapore

[73] Assignee: Berg Technology, Inc., Reno, Nev.

[21] Appl. No.: 08/525,756

[22] PCT Filed: Mar. 23, 1994

[86] PCT No.: PCT/US94/03135

§ 371 Date: Mar. 29, 1996

§ 102(e) Date: Mar. 29, 1996

[87] PCT Pub. No.: WO94/22182

PCT Pub. Date: Sep. 29, 1994

[30] Foreign Application Priority Data

Mar. 23, 1993 [JP] Japan ................... 5-013477 U

[51] Int. Cl.⁶ ................................................. H01R 13/60
[52] U.S. Cl. ....................................................... 439/541.5
[58] Field of Search .............................. 439/64, 79, 159, 439/541.5, 172, 540.1

[56] References Cited

U.S. PATENT DOCUMENTS

| | | | |
|---|---|---|---|
| 3,767,974 | 10/1973 | Donovan, Jr. et al. | 317/101 DH |
| 4,445,740 | 5/1984 | Wallace | 439/152 |
| 4,789,352 | 12/1988 | Kreinberg et al. | 439/260 |
| 4,929,185 | 5/1990 | Wong et al. | 439/74 |
| 4,952,161 | 8/1990 | Komatsu | 439/155 |
| 4,996,631 | 2/1991 | Freehauf | 361/415 |
| 5,085,590 | 2/1992 | Galloway | 439/78 |
| 5,140,501 | 8/1992 | Takahashi et al. | 361/415 |
| 5,149,276 | 9/1992 | Dixon | 439/159 |
| 5,176,523 | 1/1993 | Lai | 439/64 |
| 5,217,394 | 6/1993 | Ho | 439/541.5 |
| 5,283,713 | 2/1994 | Nagafuji et al. | 361/796 |
| 5,286,207 | 2/1994 | McHugh | 439/541.5 |
| 5,299,089 | 3/1994 | Lwee | 361/684 |
| 5,305,182 | 4/1994 | Chen | 439/541.5 |
| 5,318,452 | 6/1994 | Brennin, Jr. et al. | 439/59 |
| 5,415,569 | 5/1995 | Colleran et al. | 439/620 |
| 5,490,791 | 2/1996 | Yamada et al. | 439/159 |

FOREIGN PATENT DOCUMENTS 0 532 346 A2  3/1993  European Pat. Off. .
92 04 884 U  7/1992  Germany .

Primary Examiner—Neil Abrams
Assistant Examiner—Barry M. L. Standig
Attorney, Agent, or Firm—Woodcock Washburn Kurtz Mackiewicz & Norris, LLP

[57] ABSTRACT

A multi-storage deck connector apparatus having at least an upper and lower storage deck is connectable to a printed circuit board. Each deck has its own set of contact pins that must make electrical connection to the printed circuit board. A vertical connector is arranged between the storage decks so that the upper storage deck contact pins are connected to the vertical connector and the vertical connector is connected to the printed circuit board. The lower storage deck contact pins are connected directly to the printed circuit board.

34 Claims, 3 Drawing Sheets

MULTI-STORAGE DECK CONNECTOR APPARATUS

BACKGROUND

1. Field of the Invention

The present invention relates to a connector apparatus for memory cards, and more particularly, to a connector apparatus having multiple storage decks and an improved mechanism for connecting the respective contacts of each storage deck to a printed circuit board.

2. Description of the Prior Art

Plate-like integrated circuit cards, commonly referred to in the art as "memory cards", have become increasingly popular for use in notebook, laptop and desktop computers, as well as other consumer products. Standard specifications from the Personal Computer Memory Card International Association (PCMCIA) and the Japan Electronic Industry Development Association (JEIDA) have helped to expand this relatively new industry. Other standard specifications have been developed by the Joint Electron Device Engineering Council (JEDEC). Although commonly referred to as "memory cards," these cards are by no means limited to data storage applications. For example, some cards may perform various I/O functions for modem and local area network applications.

Currently, the PCMCIA/JEIDA standard cards incorporate a 68-pin female connector at one end, and are available in three formats. Type I houses SRAM, PSRAM, MROM, OPTROM, and flash memory chips and only performs memory functions. Type I cards have a thickness of 3.3 mm. Type II cards perform I/O functions for modem and local area network (LAN) applications. The side edges of Type II cards are 3.3 mm thick, however, the main body of the cards is 5.0 mm thick. Type III cards are really not "cards," but rather 1.8 inch hard disk drives having a 10.5 mm thick housing. Again, however, these cards are equipped with outside edges of 3.3 mm.

Given the increasing popularity of these "memory cards," a need has arisen for suitable connector devices for connecting these cards to printed circuit boards in host devices, such as notebook, laptop and desktop computers. A number of connector devices have appeared in the prior art. Prior art connector devices typically comprise some sort of frame or housing into which a memory card may be inserted. A contact header with an array of pin contacts is provided at the far end of the housing to connect with a corresponding contact array disposed in the front end of the memory card. Typically, L-shaped pin contacts are employed in the connector to facilitate connection of each pin to a printed circuit board; one end of each pin extends into the storage space of the connector, while the other end extends downwardly, external to the housing, for soldering to the printed circuit board.

Many prior art connector devices employ an ejection mechanism having a slide plate that engages with the memory card, a rotatable lever mounted on the housing and coupled at one end to the slide plate, and a push rod coupled to the other end of the lever. To eject a memory card, the push rod is manually driven toward the contact header. Movement of the push rod toward the contact header is translated through the rotating lever into movement of the slide plate away from the contact header. As the slide plate moves away from the contact header, it engages with the memory card thereby disconnecting the memory card from the array of contacts on the header and urging the memory card backward out of the connector device.

Some connector devices have multiple storage decks. For example, U.S. Pat. No. 5,149,276 discloses a connector apparatus having upper and lower storage decks. Each deck has its own array of pin contacts. As is typical of prior art connector devices with multiple storage decks, L-shaped pins are employed in each deck. Thus, the external portions of both sets of pins extend downwardly for connection to a printed circuit board mounted underneath the connector apparatus. Of course, the upper set of contact pins must protrude further from the connector before extending downwardly to the printed circuit board so as to avoid interference with the lower set of contact pins. Each set of pins are connected to the printed circuit board by soldering.

Unfortunately, the use of L-shaped pins in each storage deck has proven to be disadvantageous when attempting to solder each set of contact pins to the same printed circuit board. In particular, it has been difficult to employ surface mount techniques to connect each set of contact pins to the circuit board. Consequently, high volume production of printed circuit boards with multiple storage deck connectors is difficult to achieve.

Generally, the upper and lower storage decks are separate units and are simply mounted on top of each other to form a dual storage deck apparatus. Unfortunately, because the L-shaped contact pins of the upper deck extend outward, effectively covering the contact pins of the lower deck, surface mount techniques for soldering the respective sets of contact pins to a circuit board are difficult; the contact pins of the upper storage deck prevent easy access to the contact pins of the lower deck.

One solution to this problem is to solder the contact pins of the lower deck to the circuit board in a first soldering step prior to mounting the upper storage deck. Once the lower storage deck is secure, the upper storage deck may be mounted on the lower storage deck, and the contact pins of the upper storage deck may be soldered to the circuit board in a second soldering step. Unfortunately, however, the second soldering step can effect the hardened solder joints of the lower contact pins in such a way that stress may occur in the hardened solder joints, in components already attached to the circuit board, and in the circuit board itself. Moreover, if one of the lower contact pins breaks free during the second soldering step, resoldering is extremely difficult since the upper contacts are now in the way.

SUMMARY OF THE INVENTION

It is accordingly an object of the present invention to provide a multi-storage deck connector apparatus that avoids the disadvantages that result from having to electrically connect the contact pins of each storage deck directly to a main printed circuit board.

According to the present invention, a multi-storage deck connector apparatus for memory cards comprises:

at least upper and lower frames coupled together in a stacked arrangement, each frame having opposing side rails spaced at an interval substantially equal to the width of a memory card, each frame defining a respective storage deck of the connector apparatus;

a first array of contact pins disposed in the upper storage space;

a second plurality of contact pins disposed in the lower storage space;

a first circuit board to which one of the upper and lower arrays of contact pins is directly electrically connected;

a second circuit board to which the other array of contact pins is directly electrically connected; and a vertical connector arranged between the first circuit board and the second circuit board and adapted to electrically connect the first circuit board to the second circuit board, whereby one of the arrays of contact pins is directly electrically connected to the first circuit board and the other array of contact pins is indirectly electrically connected to the first circuit board via the second circuit board and the vertical connector. Preferably, the first and second arrays of contact pins are connected to their respective circuit boards using a surface mount soldering technique.

A method for assembling a multi-storage deck connector apparatus to a first printed circuit board in accordance with the present invention comprises the steps of:

a) attaching the lower frame to the first printed circuit board;

b) soldering to the first printed circuit board (i) the array of contact pins of the header of the lower frame and (ii) the terminals of the header of a vertical connector;

c) assembling the upper frame of the connector apparatus to the lower frame;

d) fitting a receptacle of the vertical connector over the header of the vertical connector, there being a second printed circuit board electrically connected to the terminals of said receptacle; and e) soldering the array of contact pins of the header of the upper frame to the second printed circuit board, whereby the array of contact pins of the header of the upper frame are indirectly electrically connected to the first printed circuit board via the second printed circuit board and the vertical connector. Prior to performing step (b), predetermined areas of the first printed circuit board are coated with a solder paste. Preferably, the soldering steps (b) and (e) are performed in accordance with a surface mount soldering technique.

DETAILED DESCRIPTION OF THE PREFERRED EMBODIMENTS

Figure 1:
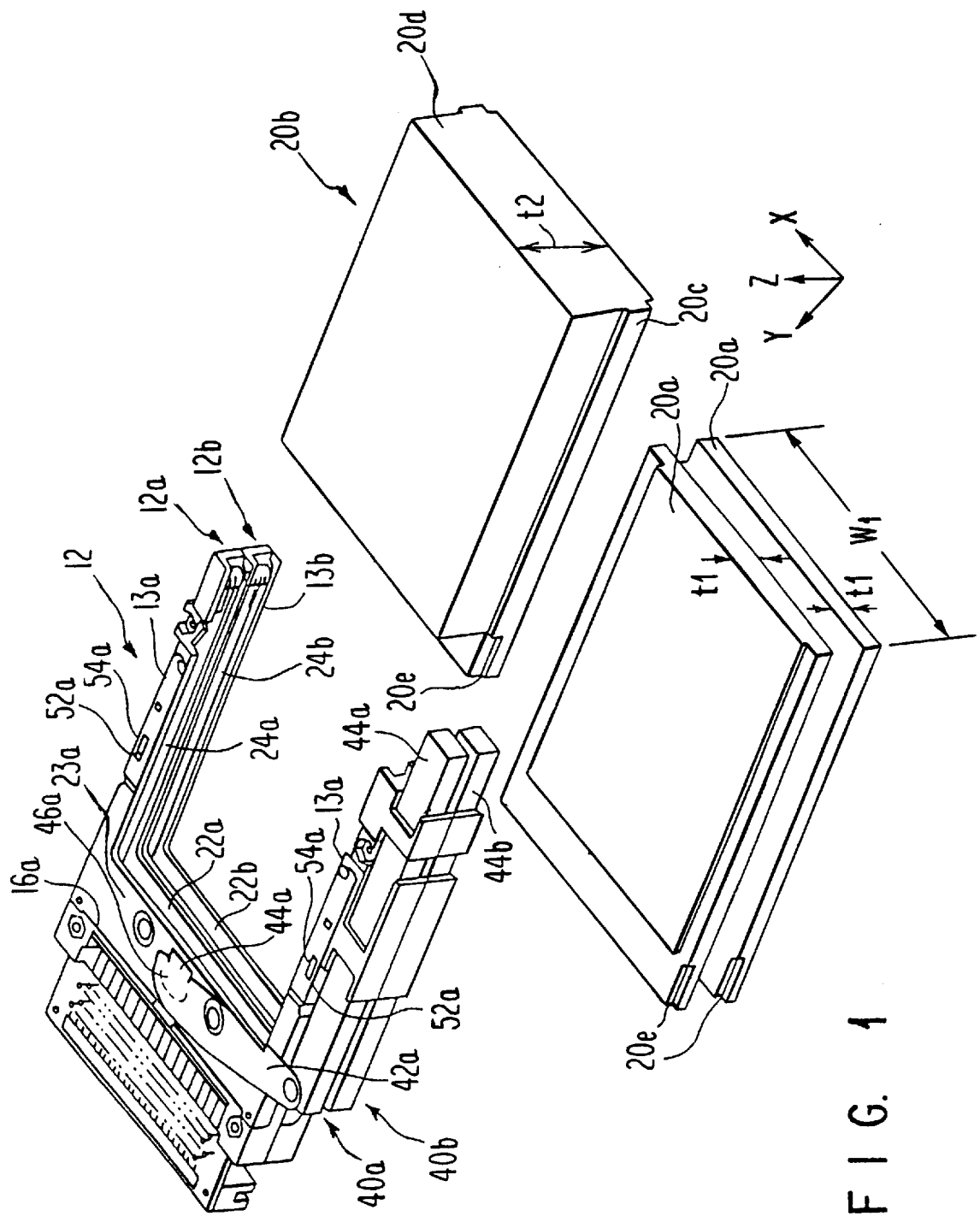
FIG. 1 is a perspective view showing a connector apparatus according to one embodiment of the present invention.
Figure 2:
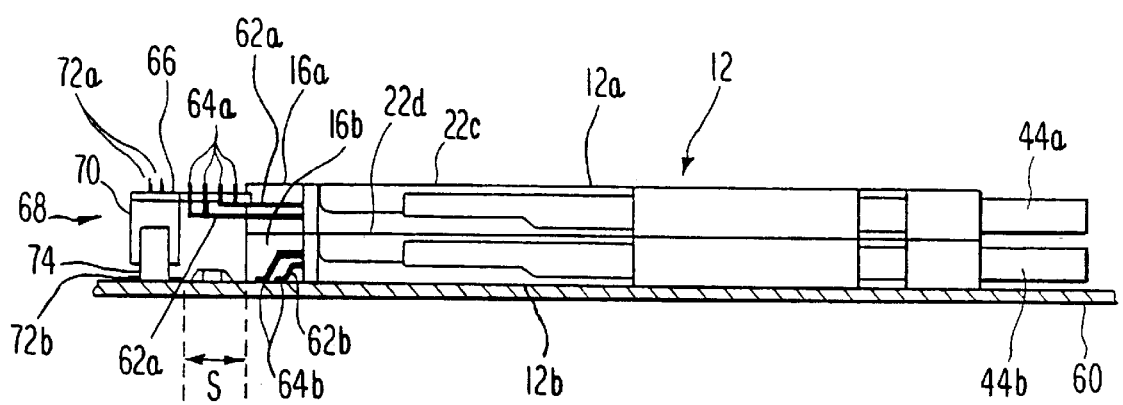
FIG. 2 is a perspective view showing the connector apparatus together with two circuit boards.

Referring to the drawings, wherein like numerals indicate like elements throughout, there is shown in FIGS. 1 and 2, a connector apparatus for memory cards in accordance with a preferred embodiment of the present invention. As used herein, the term "memory card" refers to any plate-like integrated circuit card regardless of function, including those specified by the PCMCIA, JEIDA and JEDEC associations.

As shown, the connector apparatus 12 of FIGS. 1 and 2 comprises upper and lower frames 12a and 12b which are coupled together in a stacked arrangement. Each frame 12a, 12b defines a respective storage deck 22a, 22b of the apparatus 12 and comprises a cross member 23a, 23b and a pair of side rails 13a, 13b that extend from the cross member and are spaced at an interval substantially equal to a width of a memory card. Preferably, the cross member 23 and side rails 13 of each frame 12a, 12b form a generally U-shaped structure, one end of each frame 12a, 12b being open. Upper and lower headers 16a and 16b are coupled at the other end of each frame 12a, 12b proximate the respective cross members 23a, 23b. Each header 16a, 16b carries a respective array of contact pins 64a, 64b. As can be appreciated, additional frames (not shown) can be stacked on top of frames 12a and 12b to form additional storage decks.

Slots 24a, 24b are formed in the inner surfaces of the respective side rails 13a, 13b of each frame 12a, 12b to guide memory cards 20a into and out of the respective storage decks 22a, 22b via the open ends thereof. Alternatively, one hard disc drive (HDD) package 20b, such as, for example, a type III PCMCIA card, may be stored in the connector device 12. As shown in FIG. 1, the HDD package 20b has a thickness $t_2$ and comprises a base plate section 20c, and a housing 20d containing the actual hard disk drive (not shown). The housing 20d has a width smaller than that of the base plate section 20c. The base plate section 20c has substantially the same width and height as one of the memory cards 20a.

When the HDD package 20b is inserted into the connector apparatus 12, the base plate section 20c is guided along the slots 24b in the side rails 13b of the lower frame 12b. Due to its thickness $t_2$, the HDD package will occupy both the upper and lower storage decks 22a,b when fully inserted into the connector apparatus 12. An I/O socket is disposed in the forward end 20e of each memory card 20a and the HDD package 20b for connecting to the contact pins 64a,b of the respective headers 16a,b.

Upper and lower ejecting mechanisms 40a and 40b are coupled to the upper and lower frames 12a, 12b, respectively. Preferably, the upper and lower ejecting mechanisms 40a,b are identical. As shown in FIG. 1, the upper ejecting mechanism 40a has a lever 42a pivotally supported on the cross member 23a of the upper frame 12a. One end of the lever 42a is coupled to a push rod 44a. The push rod 44a is inserted into a guide frame 43a mounted on an outer side surface of the upper frame 12a and is slidable along the Y direction. The other end of the lever 42a has a claw 46a which, through an opening 47a in the cross member 23a, engages with a slide plate 48a (FIG. 3) as described below.

Figure 3:
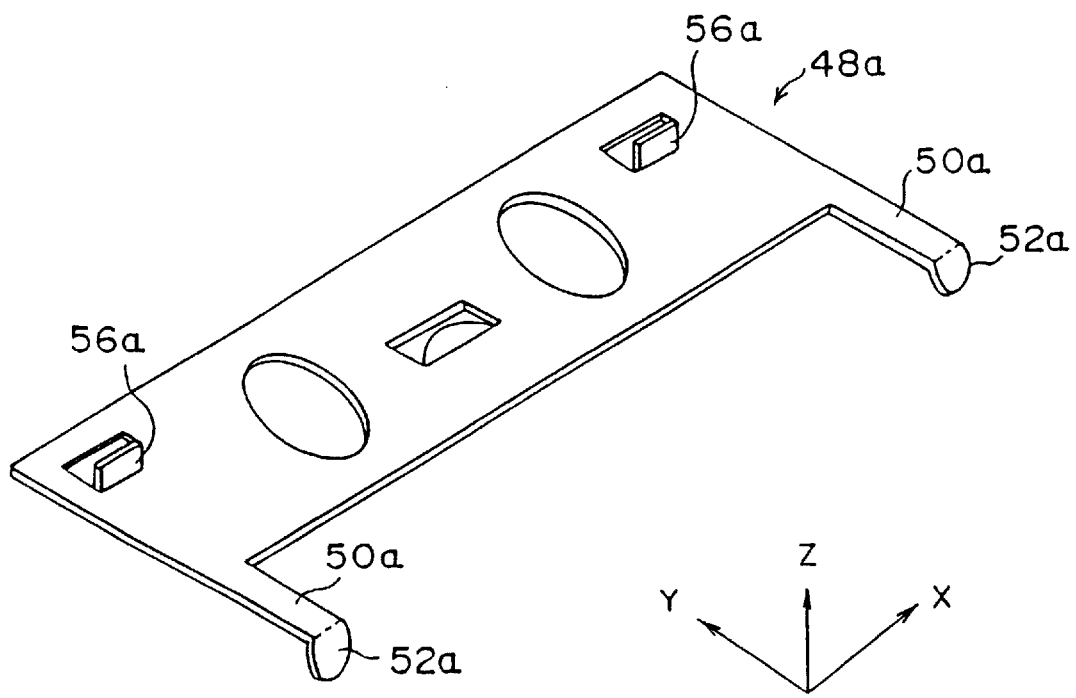
FIG. 3 is a perspective view showing the slide plate of the connector apparatus of FIG. 1.

FIG. 3 is a bottom view showing the slide plate 48a. In the present embodiment, the slide plate 48a is disposed below the cross member 23a of the upper frame 12a and has a substantially U-shaped configuration with a pair of legs 50a. Each leg 50a has a claw 52a extending substantially perpendicular thereto. The claws 52a of the slide plate 48a are guided in corresponding grooves formed in the upper surface of the side rails 13a of the upper frame 12a proximate the cross member 23a. The slide plate 48a has a pair of hooks 56a near its forward end that engage with the forward end 20e of a memory card inserted into the upper storage deck 22a. The slide plate 48a has a claw 58a at its middle that engages with the claw 46a of the lever 42a.

When a memory card, e.g. memory card 20a, is inserted into the upper deck 22a, its forward end 20e engages with the hooks 56a of the slide plate 48a causing the slide plate 48a to slide toward the header 16a. As the memory card moves further into the storage deck 12a, the I/O socket in the forward end 20e of the memory card electrically connects to the contact pins 64a of the upper header 16a.

To eject the card, the push rod 44a is pushed toward the header 16a causing the lever 42a to pivot about its midpoint such that the claw 46a of the lever 42a engages with the claw 58a of the slide plate 48a thereby urging the slide plate 48a toward the open end of the upper frame 12a. As the slide plate 48a moves toward the open end of the frame 12a, the hooks 56a of the slide plate 48a engage with the forward end 20e of the memory card thereby forcing the card backward out of the upper storage deck 22a.

Similar component parts (not shown) of the lower ejecting mechanism 40*b* are arranged between the upper and lower frames 12*a*, 12*b*. The lower ejecting mechanism 40*b* operates to eject memory cards from the lower deck 22*b*. When, an HDD package 20*b* is inserted in the apparatus 12, the lower ejecting mechanism 40*b* is used to eject the HDD package.

As shown in FIG. 2, the lower frame 12*b* of the dual storage deck apparatus 12 is mounted on a printed circuit board 60 which is omitted in FIG. 1 for convenience of illustration only. Respective interface circuits (not shown) for the upper and lower headers 16*a* and 16*b* may be printed on the printed circuit board 60.

The upper header 16*a* of the connector apparatus 12 has a plurality of L-shaped contact pins 62*a* with upturned solder tails 64*a*. According to the present invention, the solder tails 64*a* of upper array of contact pins 62*a* are inserted through corresponding solder holes in a small printed circuit board 66 and are soldered thereto. A receptacle 70 of a surface mount vertical connector 68 is mounted on the lower surface of the small printed circuit board 66. Terminals 72*a* of the receptacle 70 are soldered to the small printed circuit board 66. The small printed circuit board 66 connects each terminal 72*a* to a respective one of the solder tails 64*a*, in a one-to-one correspondence. Essentially, therefore, each terminal 72*a* is an extension of a respective one of the contact pins 62*a* of the upper header 16*a*.

A mating header 74 of the face mount vertical connector 68 is mounted on the printed circuit board 60. Mating terminals 72*b* of the header 74 are soldered to the printed circuit board 60. Like the upper header 16*a*, the lower header 16*b* of the connector apparatus has a plurality of contact pins 62*b*. Down-turned solder tails 64*b* of the contact pins 62*b* of the lower header 16*b* are soldered directly to their corresponding connection points on the main printed circuit board 60. When the upper housing 12*a* is assembled on the lower housing 12*b*, as described hereinafter in greater detail, the receptacle 70 and header 74 of the vertical connector 68 are connected together to form an electrical connection between each of the contact pins 62*a* of the upper header 16*a* and corresponding connection points on the main printed circuit board 60. That is, the small printed circuit board 66 and vertical connector 68 serve to connect each of the contact pins 62*a* of the upper header 16*a* to respective signal traces on the main printed circuit board 60. Thus, whereas the contact pins 62*b* of the lower header 16*b* are directly connected to the circuit board 60, the contact pins 62*a* of the upper header 16*a* are indirectly connected to the circuit board 60 via the small circuit board 66 and vertical connector 68.

A space S is defined between the lower header 16*b* of the connector apparatus and the header 74 of the vertical connector 68. Various circuit components may be mounted to the printed circuit board in space S.

According to a method of the present invention, the connector apparatus is assembled to the printed circuit board 60 as follows:

(i) predetermined areas on the printed circuit board 60 are coated with a solder paste;

(ii) the lower housing 12*b*, lower header 16*b* and vertical connector header 74, but not the lower ejecting mechanism 40*b*, are arranged on the printed circuit board 60 (these component parts can be located manually or by a mechanical means);

(iii) the contact pins 62*b* of the lower header 16*b* and the terminals of the header 74 of the vertical connector 68 are then connected to the printed circuit board 60 by soldering;

(iv) the lower ejecting mechanism 40*b* is then fixed to the lower housing frame 12*b* with suitable hardware;

(v) the upper housing 12*a* and the upper ejecting mechanism 40*a* are then assembled on the lower housing 12*b* (the upper and lower ejecting mechanisms 40*a* and 40*b* may be connected by a proper screw/nut combination or a locking pin);

(vi) the receptacle 70 of the vertical connector 68, which is pre-mounted on a small circuit board 66, is then fitted over the header 74; and finally, (vii) the solder tails 64*a* of the upper header 16*a* are soldered to the small printed circuit board 66.

As can be appreciated, the lower header 16*b* is directly connected to the printed circuit board 60 and the upper header 16*a* is indirectly connected to the printed circuit board 60 via the small printed circuit board 66 and vertical connector 68. Thus, the upper and lower headers 16*a* and 16*b* are both connected to the circuit board 60 without the disadvantages that result from having to directly solder both headers to that circuit board 60.

What is claimed is:

1. A multi-storage deck connector apparatus for memory cards comprising:

at least upper and lower frames coupled together in a stacked arrangement, each frame having opposing side rails spaced at an interval substantially equal to the width of a memory card, each frame defining a respective storage deck of said connector apparatus;

a first array of contact pins disposed in said upper storage space;

a second array of contact pins disposed in said lower storage space;

a first circuit board to which one of said upper and lower arrays of contact pins is directly electrically connected;

a second circuit board arranged in a parallel relation with said first circuit board to which the other array of contact pins is directly electrically connected; and a vertical connector arranged between the first circuit board and the second circuit board and adapted to electrically connect the first circuit board to the second circuit board, whereby one of said arrays of contact pins is directly electrically connected to the first circuit board and the other array of contact pins is indirectly electrically connected to the first circuit board via the second circuit board and the vertical connector.

2. A connector apparatus for connecting a memory card to a main printed circuit board, said connector apparatus comprising:

a frame having opposing side rails spaced at an interval substantially equal to the width of a memory card;

a header coupled to the frame and having an array of contact pins;

an intermediate printed circuit member arranged parallel to said main printed circuit board; and means for indirectly connecting the array of contact pins to the main printed circuit board by way of said intermediate printed circuit board.

3. The connector apparatus of claim 2 wherein the means for indirectly connecting the array of contact pins to the main printed circuit board comprises a connector soldered to the main printed circuit board, the array of contact pins being indirectly connected to the main printed circuit board via said connector.

4. The connector apparatus of claim 3 wherein said connector comprises a surface mount connector.

5. The connector apparatus of claim 3 wherein said connector comprises a vertical connector having a header portion and a mating receptacle portion, one of said header and receptacle portions being soldered to the main printed circuit board and the other of said portions being soldered to the intermediate printed circuit board.

6. The connector apparatus of claim 5, wherein said header portion is disengageable from said receptacle portion.

7. The connector apparatus of claim 3, wherein said intermediate printed circuit member comprises an intermediate printed circuit board.

8. A connector apparatus for connecting a memory card to a main printed circuit board, said connector apparatus comprising:

a frame having opposing side rails spaced at an interval substantially equal to the width of a memory card;

a header coupled to the frame and having an array of contact pins;

an intermediate printed circuit member arranged parallel to said main printed circuit board; and a connector soldered to the main printed circuit board, the array of contact pins being indirectly connected to the main printed circuit board via said intermediate printed circuit board and said connector.

9. The connector apparatus of claim 8 wherein said connector comprises a surface mount connector.

10. The connector apparatus of claim 8 wherein said connector comprises a vertical connector having a header portion and a mating receptacle portion, one of said header and receptacle portions being soldered to the main printed circuit board and the other of said portions being soldered to the intermediate printed circuit board.

11. The connector apparatus of claim 10, wherein said header portion is disengageable from said receptacle portion.

12. The connector apparatus of claim 8, wherein said intermediate printed circuit member comprises an intermediate printed circuit board.

13. A connector apparatus for connecting a memory card to a main printed circuit board, said connector apparatus comprising:

a frame having opposing side rails spaced at an interval substantially equal to the width of a memory card, said frame defining a storage space of said connector apparatus;

a header coupled to the frame and having an array of contact pins;

an intermediate printed circuit member arranged parallel to said main circuit board and to which the array of contact pins are connected; and a connector for connecting the intermediate printed circuit member to the main printed circuit board, whereby the array of contacts are indirectly connected to the main printed circuit board via the intermediate printed circuit member and said connector.

14. The connector apparatus of claim 13, wherein said intermediate printed circuit member comprises an intermediate printed circuit board.

15. The connector apparatus of claim 13 wherein said connector comprises a surface mount connector mounted on the main printed circuit board.

16. The connector apparatus of claim 13 wherein said connector comprises a vertical connector having a header portion and a mating receptacle portion, one of said header and receptacle portions being soldered to the main printed circuit board and the other of said portions being soldered to the intermediate printed circuit member.

17. The connector apparatus of claim 16, wherein said header portion is disengageable from said receptacle portion.

18. A connector apparatus for connecting a plurality of memory cards to a main printed circuit board, said connector apparatus comprising:

a plurality of frames each having opposing side rails spaced at an interval substantially equal to the width of a memory card, each of said frames defining a storage space for receiving a memory card, and each of said frames having a header coupled thereto that comprises an array of contact pins;

an intermediate printed circuit member arranged parallel to said main circuit board and to which at least one of the arrays of contact pins of said headers is connected; and a connector for connecting the intermediate printed circuit member to the main printed circuit board, whereby said at least one array of contact pins is indirectly connected to the main printed circuit board via the intermediate printed circuit member and said connector.

19. The connector apparatus of claim 18, wherein said connector comprises a surface mount connector mounted on the main printed circuit board.

20. The connector apparatus of claim 18, wherein said connector comprises a vertical connector having a header portion and a mating receptacle portion, one of said header and receptacle portions being soldered to the main printed circuit board and the other of said portions being soldered to the intermediate printed circuit member.

21. The connector apparatus of claim 20, wherein said header portion is disengageable from said receptacle portion.

22. The connector apparatus of claim 18, wherein said intermediate printed circuit member comprises an intermediate printed circuit board.

23. Apparatus for providing a connection between a device and a main printed circuit board, said apparatus comprising:

a header spaced from the main printed circuit board and having an array of contact pins for connecting to the device;

an intermediate printed circuit member arranged parallel to said main circuit board and to which the array of contact pins of the header are connected; and a connector for connecting the intermediate printed circuit member to the main printed circuit board, whereby the array of contacts of the header are indirectly connected to the main printed circuit board via the intermediate printed circuit member and said connector.

24. The apparatus of claim 23, wherein said intermediate printed circuit member comprises an intermediate printed circuit board.

25. The apparatus of claim 23 wherein said connector comprises a surface mount connector mounted on the main printed circuit board.

26. The apparatus of claim 23 wherein said connector comprises a vertical connector having a header portion and a mating receptacle portion, one of said header and receptacle portions being soldered to the main printed circuit board and the other of said portions being soldered to the intermediate printed circuit member.

27. The apparatus of claim 26, wherein said header portion is disengageable from said receptacle portion.

28. The apparatus of claim 23 wherein the device comprises a memory card.

29. Apparatus for providing connections between a plurality of devices and a main printed circuit board, said apparatus comprising:
   a plurality of headers each comprising an array of contact pins for connecting to one of said devices, said headers being arranged such that at least one header is spaced from a surface of the main printed circuit board;
   an intermediate printed circuit member arranged parallel to said main printed circuit board and to which the array of contact pins of said at least one header are connected; and
   a connector for connecting the intermediate printed circuit member to the main printed circuit board, whereby the array of contact pins of said at least one header are indirectly connected to the main printed circuit board via the intermediate printed member and said connector.

30. The apparatus of claim 29, wherein said connector comprises a surface mount connector mounted on the main printed circuit board.

31. The apparatus of claim 29, wherein said connector comprises a vertical connector having a header portion and a mating receptacle portion, one of said header and receptacle portions being soldered to the main printed circuit board and the other of said portions being soldered to the intermediate printed circuit member.

32. The apparatus of claim 31, wherein said header portion is disengageable from said receptacle portion.

33. The apparatus of claim 29, wherein said intermediate printed circuit member comprises an intermediate printed circuit board.

34. The apparatus of claim 29, wherein said plurality of devices comprises at least one memory card.

* * * * *